US006983427B2

(12) United States Patent
Wheeler et al.

(10) Patent No.: US 6,983,427 B2
(45) Date of Patent: Jan. 3, 2006

(54) GENERATING A LOGIC DESIGN

(75) Inventors: William R. Wheeler, Southborough, MA (US); Matthew J. Adiletta, Worcester, MA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/942,102

(22) Filed: Aug. 29, 2001

(65) Prior Publication Data

US 2003/0046640 A1 Mar. 6, 2003

(51) Int. Cl.
G06F 17/50 (2006.01)
(52) U.S. Cl. .................... 716/1; 716/4; 716/5; 716/18; 703/14; 703/15
(58) Field of Classification Search .............. 716/1, 716/18, 3, 4, 5; 703/14
See application file for complete search history.

(56) References Cited

U.S. PATENT DOCUMENTS

| 4,703,435 | A |   | 10/1987 | Darringer et al. |        |
|-----------|---|---|---------|------------------|--------|
| 4,970,664 | A |   | 11/1990 | Kaiser et al.    |        |
| 5,128,871 | A |   | 7/1992  | Schmitz          |        |
| 5,164,911 | A | * | 11/1992 | Juran et al. ..................... | 716/11 |
| 5,212,650 | A |   | 5/1993  | Hooper et al.    |        |
| 5,220,512 | A |   | 6/1993  | Watkins et al.   |        |
| 5,258,919 | A |   | 11/1993 | Yamanouchi et al.|        |
| 5,267,175 | A |   | 11/1993 | Hooper           |        |
| 5,278,769 | A | * | 1/1994  | Bair et al. ..................... | 703/19 |
| 5,287,289 | A |   | 2/1994  | Kageyama et al.  |        |
| 5,297,053 | A |   | 3/1994  | Pease et al.     |        |
| 5,301,318 | A | * | 4/1994  | Mittal ........................ | 716/11 |
| 5,384,710 | A | * | 1/1995  | Lam et al. .................... | 716/11 |
| 5,475,605 | A |   | 12/1995 | Lin              |        |
| 5,491,640 | A | * | 2/1996  | Sharma et al. ................ | 716/18 |
| 5,493,507 | A |   | 2/1996  | Shinde et al.    |        |
| 5,506,788 | A |   | 4/1996  | Cheng et al.     |        |
| 5,513,119 | A |   | 4/1996  | Moore et al.     |        |
| 5,544,067 | A | * | 8/1996  | Rostoker et al. .............. | 703/14 |
| 5,553,002 | A |   | 9/1996  | Dangelo et al.   |        |
| 5,555,201 | A | * | 9/1996  | Dangelo et al. ............... | 716/1  |
| 5,568,397 | A |   | 10/1996 | Yamashita et al. |        |
| 5,598,347 | A |   | 1/1997  | Iwasaki          |        |
| 5,603,015 | A |   | 2/1997  | Kurosawa et al.  |        |
| 5,604,894 | A |   | 2/1997  | Pickens et al.   |        |
| 5,629,857 | A |   | 5/1997  | Brennan          |        |
| 5,663,662 | A |   | 9/1997  | Kurosawa         |        |
| 5,666,289 | A |   | 9/1997  | Watkins          |        |

(Continued)

FOREIGN PATENT DOCUMENTS

EP          0 404 482        12/1990

(Continued)

OTHER PUBLICATIONS

Stephen Y.H. Su, An Interactive Design Automation System, Proceedings of the 10th Design Automation Workshop on Design Automation, pp. 253-261, Jun. 1973.*

(Continued)

*Primary Examiner*—A. M. Thompson
(74) *Attorney, Agent, or Firm*—Fish & Richardson P.C.

(57) ABSTRACT

A technique to generate a logic design for use in designing an integrated circuit (IC). The technique includes embedding a combinatorial one-dimensional logic block within a two-dimensional schematic presentation to form a unified database. The technique also includes following a set of design capture rules, importing the combinatorial one-dimensional logic block, and notifying a designer when importing the combinatorial data block violates the set of design capture rules.

20 Claims, 2 Drawing Sheets

U.S. PATENT DOCUMENTS

| | | | |
|---|---|---|---|
| 5,673,198 A * | 9/1997 | Lawman et al. ............... | 716/11 |
| 5,685,006 A | 11/1997 | Shiraishi | |
| 5,694,579 A | 12/1997 | Razdan et al. | |
| 5,706,476 A | 1/1998 | Giramma | |
| 5,717,928 A * | 2/1998 | Campmas et al. ............ | 716/17 |
| 5,724,250 A | 3/1998 | Kerzman et al. | |
| 5,757,655 A | 5/1998 | Shih et al. | |
| 5,809,283 A | 9/1998 | Vaidyanathan et al. | |
| 5,828,581 A | 10/1998 | Matumura | |
| 5,831,869 A * | 11/1998 | Ellis et al. ..................... | 716/6 |
| 5,841,663 A | 11/1998 | Sharma et al. | |
| 5,852,564 A | 12/1998 | King et al. | |
| 5,883,814 A | 3/1999 | Luk et al. | |
| 5,889,677 A | 3/1999 | Yasuda et al. | |
| 5,892,678 A | 4/1999 | Tokunoh et al. | |
| 5,892,682 A | 4/1999 | Hasley et al. | |
| 5,903,469 A | 5/1999 | Ho | |
| 5,933,356 A | 8/1999 | Rostoker et al. | |
| 5,937,190 A | 8/1999 | Gregory et al. | |
| 5,963,724 A | 10/1999 | Mantooth et al. | |
| 5,974,242 A | 10/1999 | Damarla et al. | |
| 6,044,211 A | 3/2000 | Jain | |
| 6,053,947 A | 4/2000 | Parson | |
| 6,066,179 A | 5/2000 | Allan | |
| 6,077,304 A | 6/2000 | Kasuya | |
| 6,106,568 A | 8/2000 | Beausang et al. | |
| 6,117,183 A | 9/2000 | Teranishi et al. | |
| 6,120,549 A | 9/2000 | Goslin et al. | |
| 6,132,109 A | 10/2000 | Gregory et al. | |
| 6,135,647 A | 10/2000 | Balakrishnan et al. | |
| 6,152,612 A | 11/2000 | Liao et al. | |
| 6,161,211 A * | 12/2000 | Southgate ....................... | 716/1 |
| 6,178,541 B1 * | 1/2001 | Joly et al. ...................... | 716/17 |
| 6,205,573 B1 | 3/2001 | Hasegawa | |
| 6,208,954 B1 | 3/2001 | Houtchens | |
| 6,216,256 B1 | 4/2001 | Inoue et al. | |
| 6,219,822 B1 | 4/2001 | Gristede et al. | |
| 6,226,780 B1 * | 5/2001 | Bahra et al. ................... | 716/18 |
| 6,233,540 B1 | 5/2001 | Schaumont et al. | |
| 6,233,723 B1 | 5/2001 | Pribetich | |
| 6,234,658 B1 | 5/2001 | Houldsworth | |
| 6,236,956 B1 | 5/2001 | Mantooth et al. | |
| 6,260,179 B1 | 7/2001 | Ohsawa et al. | |
| 6,272,671 B1 | 8/2001 | Fakhry | |
| 6,275,973 B1 | 8/2001 | Wein | |
| 6,292,931 B1 | 9/2001 | Dupenloup | |
| 6,298,468 B1 | 10/2001 | Zhen | |
| 6,311,309 B1 | 10/2001 | Southgate | |
| 6,324,678 B1 | 11/2001 | Dangelo et al. | |
| 6,327,693 B1 | 12/2001 | Cheng et al. | |
| 6,353,806 B1 | 3/2002 | Gehlot | |
| 6,353,915 B1 | 3/2002 | Deal et al. | |
| 6,360,355 B1 * | 3/2002 | Nishida et al. ............... | 716/18 |
| 6,360,356 B1 * | 3/2002 | Eng ............................ | 716/18 |
| 6,366,874 B1 | 4/2002 | Lee et al. | |
| 6,367,064 B1 * | 4/2002 | Brown ......................... | 716/18 |
| 6,378,115 B1 | 4/2002 | Sakurai | |
| 6,381,563 B1 | 4/2002 | O'Riordan et al. | |
| 6,381,565 B1 | 4/2002 | Nakamura | |
| 6,401,230 B1 | 6/2002 | Ahanessians et al. | |
| 6,421,816 B1 | 7/2002 | Ishikura | |
| 6,438,729 B1 | 8/2002 | Ho | |
| 6,438,731 B1 | 8/2002 | Segal | |
| 6,440,780 B1 | 8/2002 | Kimura et al. | |
| 6,449,762 B1 | 9/2002 | McElvain | |
| 6,457,164 B1 | 9/2002 | Hwang et al. | |
| 6,473,885 B1 | 10/2002 | Wallace | |
| 6,477,683 B1 | 11/2002 | Killian et al. | |
| 6,477,688 B1 | 11/2002 | Wallace | |
| 6,477,689 B1 | 11/2002 | Mandell et al. | |
| 6,480,985 B1 * | 11/2002 | Reynolds et al. ............. | 716/1 |
| 6,487,698 B1 | 11/2002 | Andreev et al. | |
| 6,490,545 B1 | 12/2002 | Peng | |
| 6,505,328 B1 * | 1/2003 | Van Ginneken et al. ........ | 716/7 |
| 6,505,341 B1 | 1/2003 | Harris et al. | |
| 6,516,456 B1 * | 2/2003 | Garnett et al. ................. | 716/8 |
| 6,519,742 B1 | 2/2003 | Falk | |
| 6,519,755 B1 | 2/2003 | Anderson | |
| 6,523,156 B2 | 2/2003 | Cirit | |
| 6,539,536 B1 | 3/2003 | Singh et al. | |
| RE38,059 E | 4/2003 | Yano et al. | |
| 6,546,528 B1 | 4/2003 | Sasaki et al. | |
| 6,574,787 B1 | 6/2003 | Anderson | |
| 6,591,407 B1 | 7/2003 | Kaufman et al. | |
| 6,675,359 B2 * | 1/2004 | Gilford et al. .................. | 716/1 |
| 6,728,945 B1 * | 4/2004 | Wang .......................... | 716/18 |
| 6,862,563 B1 * | 3/2005 | Hakewill et al. ............. | 703/14 |
| 2001/0018758 A1 | 8/2001 | Tanaka et al. | |
| 2002/0023256 A1 | 2/2002 | Seawright | |
| 2002/0038447 A1 | 3/2002 | Kim et al. | |
| 2002/0042904 A1 | 4/2002 | Ito et al. | |
| 2002/0046386 A1 | 4/2002 | Skoll et al. | |
| 2002/0049957 A1 | 4/2002 | Hosono et al. | |
| 2002/0059054 A1 | 5/2002 | Bade et al. | |
| 2002/0112221 A1 | 8/2002 | Ferreri et al. | |
| 2002/0138244 A1 | 9/2002 | Meyer | |
| 2002/0166100 A1 | 11/2002 | Meding | |
| 2003/0004699 A1 | 1/2003 | Choi et al. | |
| 2003/0005396 A1 | 1/2003 | Chen et al. | |
| 2003/0016206 A1 | 1/2003 | Taitel | |
| 2003/0016246 A1 | 1/2003 | Singh | |
| 2003/0036871 A1 | 2/2003 | Fuller et al. | |
| 2003/0177455 A1 | 9/2003 | Kaufman et al. | |

FOREIGN PATENT DOCUMENTS

| | | |
|---|---|---|
| EP | 0 433 066 | 6/1991 |
| EP | 0 720 233 | 7/1996 |
| EP | 0 901 088 | 3/1999 |
| EP | 1 065 611 | 1/2001 |
| JP | 58-060559 | 4/1983 |
| JP | 03-225523 | 10/1991 |
| JP | 07-049890 | 2/1995 |
| JP | 08-314892 | 11/1996 |
| JP | 2001-068994 | 3/2001 |
| WO | WO98/37475 | 8/1998 |
| WO | WO 98/55879 | 12/1998 |
| WO | WO 99/39268 | 8/1999 |
| WO | WO 00/65492 | 11/2000 |

OTHER PUBLICATIONS

G. Odawara et al., A Symbolic Functional Description Language, 21st Proceedings of the Design Automation COnference on Design Automation, pp. 73-80, Jun. 1984.*

D. Fischer et al., NETHDL: Abstraction of Schematics to High-Level HDL, Proceedings of the European Design Automation Conference, pp. 90-96, Mar. 1990.*

P. Eles et al., Compiling VHDL into a High-Level Synthesis Representation, Proceedings of the Conference on European Design Automation, pp. 604-609, Nov. 1992.*

Stephen Y. H. Su, An Interactive Design Automation System, Proceedings of the 10th Workshop on Design automation pp. 253-261, Jun. 1973.*

P. Jain, A Comprehensive Pre-RTL IC Design Methodology, 1995 IEEE International Verilog HDL Conference, pp. 119-126, Mar. 1995.*

Renoir, HDL Design Datasheet, Mentor Graphics, 1-8, 1999.

Foley et al., "An Object Based Graphical User Interface for Power Systems", IEEE Transactions on Power Systems, vol. 8, No. 1, Feb. 1993, pp. 97-104.

Pedram et al., "Floorplanning with Pin assignment", 1990 IEEE International Conference on Computer-Aided Design, Nov. 11, 1990, pp. 98-101.

Renoir, HDL Design Datasheet, Mentor Graphics, 1-8, 1999.

Mentor Graphics Corporation, Renoir™, pp. 1-6, 1998, Oregon.

Mentor Graphics Corporation, Renoir HDL Design Datasheet, pp. 1-2, 1999, Oregon.

Computer Design, "After Hard Knocks, Cycle-Based Simulators Stand Their Ground". http://www.computer-design.com/Editorial/1996/10/ASIC/after.html, accessed on Aug. 23, 2001, pp. 1-5.

Mentor Graphics Corporation, Renoir™ with HDL2Graphics™, 1998, Oregon.

Mentor Graphics Corporation, Renoir HDL Design Datasheet, 1999, Oregon.

Computer Design, "After Hard Knocks, Cycle-Based Simulators Stand Their Ground". http://www.computer-design.com/Editorial/1996/10/ASIC/after.html, accessed on Aug. 23, 2001, pp. 1-5.

Gassenfeit, E. H., "Control System Design Realization via VHDL-A: Requirements", Proceedings of the 1996 IEEE International Symposium on Computer-Aided Control System Design, Sep. 15, 1996, pp. 282-285.

Kutzschebauch, "Efficient logic optimization using regularity extraction", Proceedings of 2000 International Conference on Computer Design, Sep. 17, 2000, pp. 487-493.

Lahti, et al., "SADE: a Graphical Toll for VHDL-Based System Analysis", 1991 IEEE International Conference on Computer-Aided Design, Nov. 11, 1991, pp. 262-265.

Lin, et al., "A Goal Tree Based High-Level Test Planning System for DSP Real Number Models", 1998 Proceedings of International Test Conference, Oct. 18, 1998, pp. 1000-1009.

Maxfield, C., "Digital Logic Simulation: Event-Driven, Cycle-Based, and Home-Brewed", *Electrical Design News*, 41(14):129-136 (1996).

NB84035598, "Binary Relational Schema to Model Structured LSI Design", IBM Technical Disclosure Bulletin, vol. 26, No. 10B, Mar. 1984, pp. 5598-5601.

NN7807629, "Functional Oriented Symbolic Macromodeling Algorithm", IBM Technical Disclosure Bulletin, vol. 21, No. 2, Jul. 1978, pp. 629-631.

NN8006341, "Macro Physical-To-Logical Checking LSI Chip Design", IBM Technical Disclosure Bulletin, vol. 23, No. 1, Jun. 1980, pp. 341-345.

NN9407481, "Functional Modeling using object Collaboration Diagram", IBM Technical Disclosure Bulletin, vol. 37, No. 7, Jul. 1994, pp. 481-486.

Parlakbilek, et al., "A Multiple-Strength Multiple-Delay Compiled-Code Logic Simulator", *IEEE Transactins on Computer-Aided Design of Integrated Circuits and Systems*, 12(12):1937-1946 (1993).

Yli-Pietila, et al., "The Design and Simulation of Complex Multitechnology Systems", IEEE International Conference on Systems Engineering, Aug. 9, 1990, pp. 474-477.

* cited by examiner

GENERATING A LOGIC DESIGN

TECHNICAL FIELD

This invention relates to integrated circuit design tools.

BACKGROUND

Logic designs for integrated circuits (IC) typically include either schematic design or text design. A schematic design shows a computer chip with logic elements as a two-dimension diagram. Logic elements are either state elements (e.g., flip-flops, latches, etc.) or combinatorial elements (e.g. AND gates, NOR gates, etc.). Various geometric figures represent the logic elements. Lines drawn into or out of the logic elements generally represent input, output, clock, or enabling signals. Lines connecting such geometric shapes indicate a functional logic relationship between the logic elements.

A textual representation describes the logic elements of the computer chip using one-dimensional text lines. Textual representations are used in hardware description languages (HDLs) which allow designers to simulate logic designs prior to forming the logic on silicon. Examples of such languages include Verilog and Very High Speed Integrated Circuit (VHSIC) Hardware Description Language (VHDL). Using these languages, a designer can write code to simulate a logic design and execute the code in order to determine if the logic design performs properly.

Standard computer languages may also be used to simulate a logic design. One example of a standard computer language that may be used is C++.

DESCRIPTION

Figure 1:
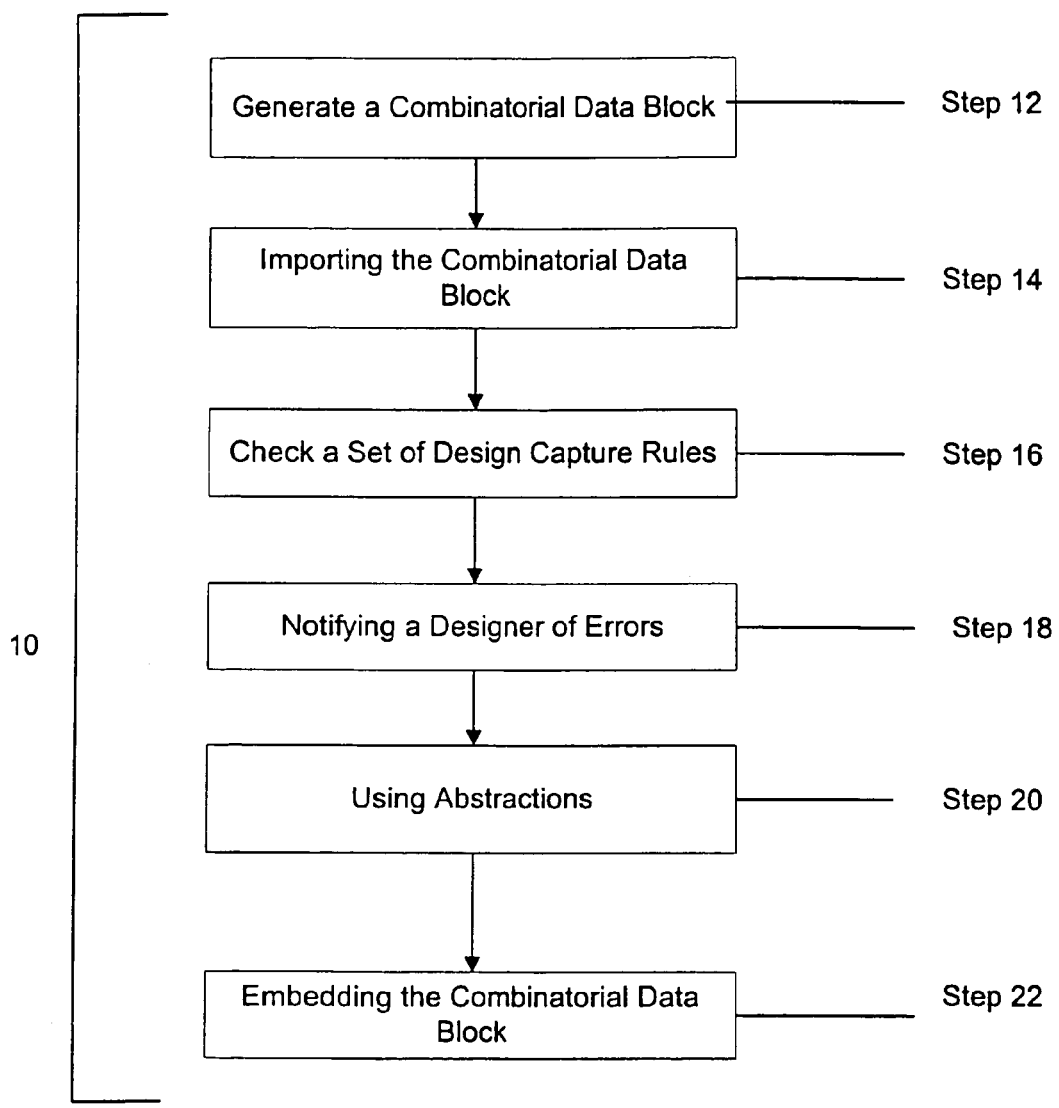
FIG. 1 is a flowchart showing a process for generating a logic design.

Referring to FIG. 1, a process 10 is shown for generating a logic design which includes both schematic design and textual design features. Process 10 may be implemented using a computer program running on a computer or other type of machine, as described in more detail below. The process 10 accesses a unified database that represents a complete visual model of an integrated circuit (IC) and which embeds a combinatorial one-dimensional data block. The combinatorial data block allows for a blending of the textual design into a two-dimensional representation. In addition, a set of abstractions is used by process 10 to shorten the development time of the unified database. The unified database can be used by both designers and implementers of IC design to create an IC without referring to two separate and disconnected design schemes.

The unified database is represented in Register Transfer Diagrams (RTDs), which are two-dimensional representations of the IC design. RTDs are hierarchical diagrams that illustrate all state elements of an IC design while allowing a user to abstract the combinatorial logic into simple boxes. RTDs concisely convey (1) all state elements, (2) the partitioning of work to be accomplished between the state elements, (3) the flow of data through state elements, (4) the partitioning and logical organization of the design within and between levels of hierarchy, (5) the intent of the design and (6) signal information.

In operation, process 10 generates the combinatorial data block (12). The IC designer determines that in a particular portion of the IC design a combinatorial element is required. A textual description is used, to represent the combinatorial element. The textual description is preferable in a simplified form to avoid complexities introduced by complex textual descriptions that otherwise need to be accounted for in the design process. Thus, the combinatorial data block includes a textual description that is in a simplified form in order to ease integration into two-dimensional or graphics level scheme. The simplification follows a set of design capture rules. For an example, a combinatorial data block is represented in Verilog as follows:

```
always @ ( )
begin
    case (f2_ctx_w)        // synopsys      parallel_case
        3'b000: next_seq_thd_w = 3'b001;
        3'b001: next_seq_thd_w = 3'b010;
        3'b010: next_seq_thd_w = 3'b011;
        3'b011: next_seq_thd_w = 3'b100;
        3'b100: next_seq_thd_w = 3'b101;
        3'b101: next_seq_thd_w = 3'b110;
        3'b110: next_seq_thd_w = 3'b111;
        3'b111: next_seq_thd_w = 3'b000;
    endcase
end
```

The design capture rules used to simplify the combinatorial data block in this example include: (1) avoiding the use of declarations and (2) avoiding entries in a sensitivity list. If declarations and entries were used, these fields would need to be changed if the IC design changes and the combinatorial block were affected. By not allowing declarations or entries in the sensitivity list in the combinatorial data block, process 10 eliminates the need for the IC designer to update these fields during the IC development process. In other words, as changes occur in the IC design, there are no manual updates needed by the IC designer to account for these changes. By setting-up these restrictions, there is less opportunity for human error when design changes occur. Other design capture rules may be implemented to simplify the combinatorial data block and eliminate unnecessary updates as the design develops.

Process 10 imports the combinatorial data block (14). In this embodiment, this is performed on a computer system as described below through an input/output interface (e.g., mouse, keyboard). When the combinatorial data block is imported to the logic design system, process 10 checks to ensure that the design capture rules for generating the combinatorial data block were followed from 12 (16). Process 10 notifies the designer if an error has occurred (18). For example, an error message is displayed on the IC designer's computer screen.

Process 10 uses a set of abstractions to facilitate the development of the unified database (20). The set of abstractions are abbreviated representations of various logic components. For example, a comparator has thousands of transistors. The creation of each and every transistor in the IC design or carrying the data associated with each transistor would be cumbersome. The abbreviated representation would be a block diagram with an input and an output. Abstractions can be instantiated from a library so that creating a logical component from an abstraction is fast and easy for a designer to do. For example, the IC design tools employing process 10 reside on a personal computer and the tools operate in a MS-Windows® environment. If the IC designer determines a comparator is needed in the design, the designer pulls-down a menu in the application and selects a comparator. Subsequent boxes appear and the designer checks-off blocks as to the parameters (e.g., inputs) needed for the comparator. After the designer chooses the logic component by using the set of abstractions, it is saved in the unified database.

Process 10 embeds the combinatorial data block into the two-dimensional schematic presentation to complete the unified data base (22). Thus, the unified data base is a complete representation of the IC and can be represented in RTDs.

Normally, during an IC design process, designers implement block diagrams at the start of the design process and develop the design using RTL code, a one-dimensional text description. Often the block diagrams are not kept up-to-date because the designer makes all the changes to the RTL so that the RTL becomes the design code. The unified database generated by process 10 ensures configuration management of the IC design by keeping all the design information in one location throughout the design process. Thus, this logic design scheme eliminates traditional ambiguities that occur between previous implementation and design models because of the constant iterations of reconciling both the schematic and textual design schemes. Having a unified database, process allows for the generation of C++ and Verilog from one location. It also allows for generation of synthesizable Verilog from textual and visual elements.

Figure 2:
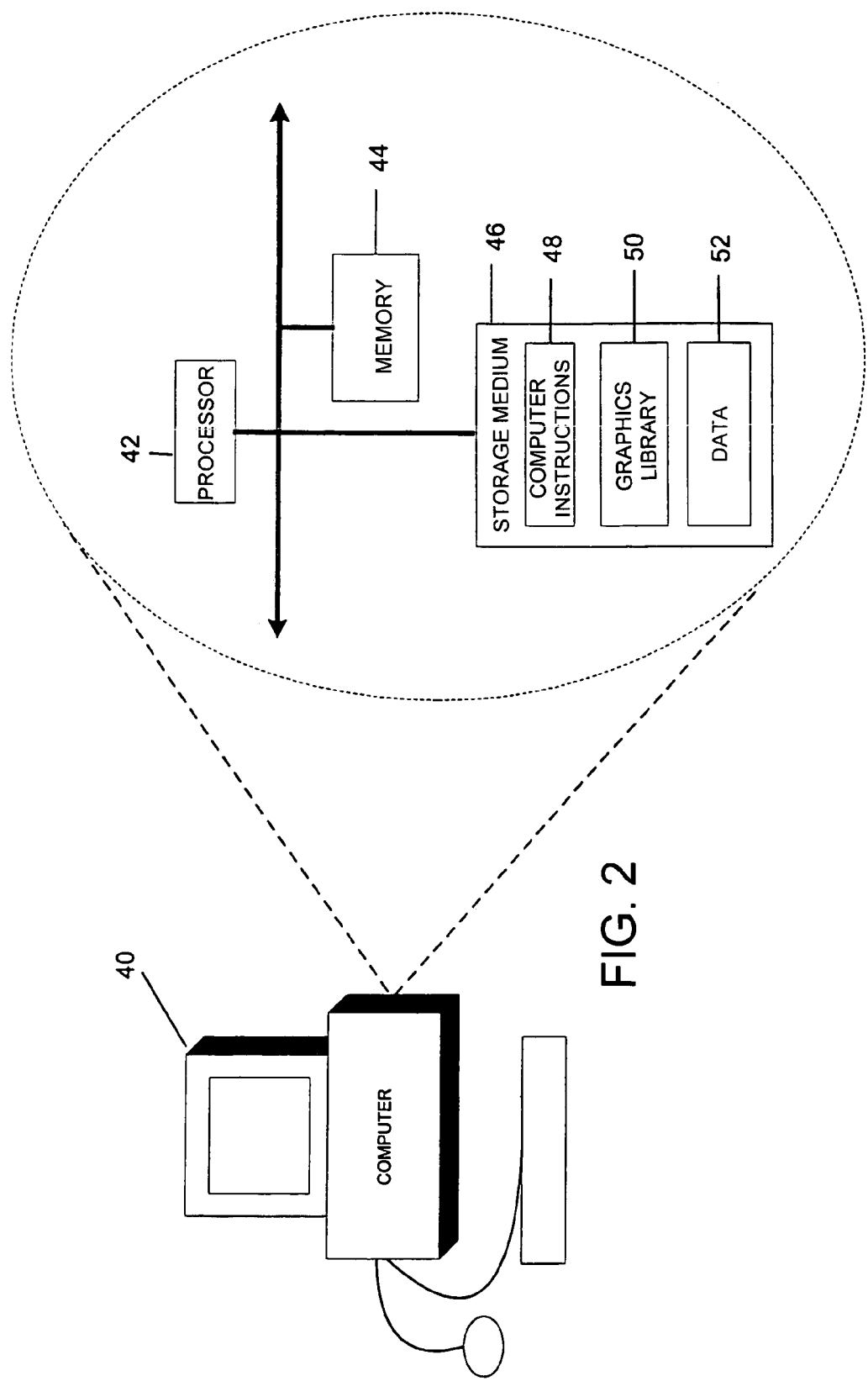
FIG. 2 is a block diagram of a computer system on which the process of FIG. 1 may be performed.

FIG. 2 shows a computer 40 for generating a logic design using process 10. Computer 40 includes a processor 42, a memory 44, and a storage medium 46 (e.g., a hard disk). Storage medium 46 stores data 52 which defines a logic design, a graphics library 50 for implementing the logic design, and machine-executable instructions 48, which are executed by processor 42 out of memory 44 to perform process 10 on data 52.

Process 10, however, is not limited to use with the hardware and software of FIG. 2; it may find applicability in any computing or processing environment. Process 10 may be implemented in hardware, software, or a combination of the two. Process 10 may be implemented in computer programs executing on programmable computers or other machines that each includes a processor, a storage medium readable by the processor (including volatile and non-volatile memory and/or storage elements), at least one input device, and one or more output devices. Program code may be applied to data entered using an input device, such as a mouse or a keyboard, to perform process 10 and to generate a simulation.

Each such program may be implemented in a high level procedural or object-oriented programming language to communicate with a computer system. However, the programs can be implemented in assembly or machine language. The language may be a compiled or an interpreted language.

Each computer program may be stored on an article of manufacture, such as a storage medium or device (e.g., CD-ROM, hard disk, or magnetic diskette), that is readable by a general or special purpose programmable machine for configuring and operating the machine when the storage medium or device is read by the machine to perform process 10. Process 10 may also be implemented as a machine-readable storage medium, configured with a computer program, where, upon execution, instructions in the computer program cause the machine to operate in accordance with process 10.

The invention is not limited to the specific embodiments set forth above. For example, process 10 is not limited to embedding one-dimensional design into a two-dimensional design. Process can be any n-dimensional design embedded into a (n+m)-dimensional design, where n≧1 and m≧1. Process 10 is not limited to the computer languages set forth above, e.g., Verilog, C++, and VHDL. It may be implemented using any appropriate computer language. Process 10 is also not limited to the order set forth in FIG. 1. That is, the blocks of process 10 may be executed in a different order than that shown to produce an acceptable result.

Other embodiments not described herein are also within the scope of the following claims.

What is claimed is:

1. A method of generating a logic design for use in designing an integrated circuit (IC), comprising:
   generating a computer instruction;
   importing the computer instruction from memory; and
   embedding the computer instruction within a two-dimensional schematic representation of the logic design to produce a unified database representation of the logic design, the computer instruction being devoid of declarations and entries to a sensitivity list;
   wherein the two-dimensional schematic representation includes a set of Register Transfer Diagrams (RTD).

2. The method of claim 1, further comprising notifying a designer when capturing data using the computer instruction violates a set of design capture rules.

3. The method of claim 1, further comprising generating C++ from the unified database.

4. The method of claim 3, further comprising generating Verilog from the unified database.

5. The method of claim 1, further comprising generating synthesizable Verilog from the unified database.

6. The method of claim 1, further comprising enabling a user to change the logic design by amending the computer instruction.

7. An article comprising a machine-readable medium which stores executable instructions to generate a logic design for use in designing an integrated circuit (IC), the instructions causing a machine to:
   generate a computer instruction;
   embed the computer instruction within a two-dimensional schematic representation of the logic design to produce a unified database representation of the logic design, the computer instruction being devoid of declarations and entries to a sensitivity list;
   wherein the two-dimensional schematic representation includes a set of Register Transfer Diagrams (RTD).

8. The article of claim 7, further comprising instructions causing a machine to import the computer instruction.

9. The article of claim 7, further comprising instructions causing a machine to notify a designer when capturing data violates a set of design capture rules.

10. The article of claim 7, further comprising instructions causing a machine to generate C++ from the unified database.

11. The article of claim 7, further comprising instructions causing a machine to generate Verilog from the unified database.

12. The article of claim 7, further comprising instructions causing a machine to generate synthesizable Verilog from the unified database.

13. The article of claim 7, further comprising instructions causing a machine to enable a user to change the logic design by amending the computer instruction.

14. An apparatus for generating a logic design for use in designing an integrated circuit (IC), comprising:
- a memory that stores executable instructions; and
- a processor that executes the instructions to:
- generate a computer instruction; and
- embed the computer instruction within a two-dimensional schematic representation of the logic design to produce a unified database representation of the logic design, the computer instruction being devoid of declarations and entries to a sensitivity list;
- wherein the two-dimensional schematic representation includes a set of Register Transfer Diagrams (RTD).

15. The apparatus of claim 14, further comprising instructions to import the computer instruction.

16. The apparatus of claim 14, further comprising instructions to notify a designer when capturing data violates a set of design capture rules.

17. The apparatus of claim 14, further comprising instructions to generate C++ from the unified database.

18. The apparatus of claim 17, further comprising instructions to generate Verilog from the unified database.

19. The apparatus of claim 14, further comprising instructions to generate synthesizable Verilog from the unified database.

20. The apparatus of claim 14, further comprising instructions to enable a user to change the logic design by amending the computer instruction.

* * * * *